(12) United States Patent
Yamada et al.

(10) Patent No.: US 10,840,096 B2
(45) Date of Patent: Nov. 17, 2020

(54) METHOD FOR PROCESSING SUBSTRATE

(71) Applicant: SCREEN HOLDINGS CO., LTD., Kyoto (JP)

(72) Inventors: Takahiro Yamada, Kyoto (JP); Masahiko Harumoto, Kyoto (JP); Yuji Tanaka, Kyoto (JP)

(73) Assignee: SCREEN HOLDINGS CO., LTD., Kyoto (JP)

( * ) Notice: Subject to any disclaimer, the term of this patent is extended or adjusted under 35 U.S.C. 154(b) by 0 days.

(21) Appl. No.: 16/318,340

(22) PCT Filed: Jul. 14, 2017

(86) PCT No.: PCT/JP2017/025747
§ 371 (c)(1),
(2) Date: Jan. 16, 2019

(87) PCT Pub. No.: WO2018/055881
PCT Pub. Date: Mar. 29, 2018

(65) Prior Publication Data
US 2019/0228964 A1    Jul. 25, 2019

(30) Foreign Application Priority Data

Sep. 23, 2016 (JP) .................................. 2016-185435

(51) Int. Cl.
*H01L 21/027*     (2006.01)
*H01L 21/02*      (2006.01)
(Continued)

(52) U.S. Cl.
CPC ............ *H01L 21/0271* (2013.01); *B81C 1/00* (2013.01); *B82Y 30/00* (2013.01); *G03F 7/40* (2013.01);
(Continued)

(58) Field of Classification Search
CPC ............. H01L 21/0338; H01L 21/0337; H01L 21/67115; H01L 21/67126; H01L 21/6715; H01L 21/67178
See application file for complete search history.

(56) References Cited

U.S. PATENT DOCUMENTS

2010/0167185 A1    7/2010 Suzuki et al.
2014/0022521 A1 *  1/2014 Harumoto ............... B05C 11/00
                                                   355/27
(Continued)

FOREIGN PATENT DOCUMENTS

JP     2013-160621 A     8/2013
JP     2013-228492 A    11/2013
(Continued)

OTHER PUBLICATIONS

International Search Report issued in corresponding International Patent Application No. PCT/JP2017/025747, dated Oct. 17, 2017, with English Translation.
(Continued)

*Primary Examiner* — Ermias T Woldegeorgis
(74) *Attorney, Agent, or Firm* — McDermott Will & Emery LLP (57) ABSTRACT

A substrate on which a processing film made of a directed self-assembly material is formed is placed on a holding plate incorporating a preheating mechanism, and is preheated. A low oxygen atmosphere surrounds the substrate. A preheating temperature is a temperature at which the directed self-assembly material comprised of two types of polymers is phase-separated. By preheating the processing film, the two types of polymers are phase-separated to form a fine pattern. The processing film is irradiated with flashes of light from flash lamps while being preheated. This increases the fluidity of the polymers constituting the processing film to
(Continued)

achieve the formation of a fine pattern while suppressing the occurrence of defects.

5 Claims, 5 Drawing Sheets

(51) Int. Cl.
    *B81C 1/00*     (2006.01)
    *H01L 21/67*     (2006.01)
    *G03F 7/40*     (2006.01)
    *H01L 21/311*     (2006.01)
    *H01L 21/687*     (2006.01)
    *B82Y 30/00*     (2011.01)
    *H01L 21/033*     (2006.01)

(52) U.S. Cl.
    CPC .. *H01L 21/02118* (2013.01); *H01L 21/02345* (2013.01); *H01L 21/0337* (2013.01); *H01L 21/0338* (2013.01); *H01L 21/31133* (2013.01); *H01L 21/6715* (2013.01); *H01L 21/67115* (2013.01); *H01L 21/67126* (2013.01); *H01L 21/67178* (2013.01); *H01L 21/68742* (2013.01)

(56) References Cited

U.S. PATENT DOCUMENTS

| | | | |
|---|---|---|---|
| 2014/0072722 A1 | 3/2014 | Kawanishi et al. | |
| 2014/0106575 A1* | 4/2014 | Yoshimoto | H01L 21/02118 438/781 |
| 2014/0178824 A1* | 6/2014 | E Preil | G03F 7/0002 430/325 |
| 2014/0273522 A1 | 9/2014 | Rathsack | |
| 2015/0062545 A1 | 3/2015 | Muramatsu et al. | |
| 2015/0072536 A1 | 3/2015 | Muramatsu et al. | |
| 2015/0197663 A1 | 7/2015 | Mizutani et al. | |
| 2017/0199463 A1 | 7/2017 | Owada et al. | |
| 2017/0336711 A1 | 11/2017 | Yamada | |

FOREIGN PATENT DOCUMENTS

| | | |
|---|---|---|
| JP | 2014-022570 A | 2/2014 |
| JP | 2014-053558 A | 3/2014 |
| JP | 2015-179272 A | 10/2015 |
| JP | 2016-024904 A | 2/2016 |
| JP | 2016-085265 A | 5/2016 |
| JP | 2016-518701 A | 6/2016 |
| JP | 2016-165726 A | 9/2016 |
| TW | 201030455 A | 8/2010 |
| TW | 201428046 A | 7/2014 |
| TW | 201624146 A | 7/2016 |

OTHER PUBLICATIONS

Taiwanese Office Action issued in corresponding Taiwanese Patent Application No. 106123667, dated Mar. 20, 2018, with partial English Translation.
Taiwanese Office Action issued in corresponding Taiwanese Patent Application No. 106123667, dated Sep. 10, 2018, with partial English Tranlsation.
Japanese Decision to Grant a Patent issued in corresponding Japanese Patent Application No. 2016-185435, dated Mar. 3, 2020, with English translation.

* cited by examiner

METHOD FOR PROCESSING SUBSTRATE

CROSS REFERENCE TO RELATED APPLICATIONS

This application is the U.S. National Phase under 35 US.C. § 371 of International Application No. PCT/JP2017/025747, filed on Jul. 14, 2017, which claims the benefit of Japanese Application No. 2016-185435, filed on Sep. 23, 2016, the entire contents of each are hereby incorporated by reference.

TECHNICAL FIELD

The present invention relates to a substrate processing method which forms a pattern on a thin plate-like precision electronic substrate (hereinafter referred to simply as a "substrate") such as a semiconductor wafer and, more particularly, to a substrate processing method which uses a directed self-assembly technique to form a pattern.

BACKGROUND ART

Photolithography has been hitherto used as a typical technique for forming a pattern on a substrate such as a semiconductor wafer. Photolithography is a technique including: applying a resist that is a photosensitive material onto a substrate; performing an exposure process on the resist with the use of a mask where the shape of a circuit diagram is drawn; and thereafter performing a development process to remove excess resist, thereby forming a pattern of the circuit diagram.

A higher degree of integration of semiconductor devices necessitates finer patterns. The finer patterns by means of photolithography have been accomplished by the use of short-wavelength light sources during the exposure process. For example, ArF excimer lasers (with a wavelength of 193 nm) are mainly used at present as the light sources for the exposure process. Even if such short-wavelength light sources are used, the limit of the finer patterns by means of photolithography is considered to be approximately 45 nm.

EUV (extreme ultraviolet) exposure and electron beam direct writing, for example, have been proposed as photolithography techniques capable of forming patterns finer than 45 nm. However, the EUV exposure is disadvantageous in requiring significantly high costs, and the electron beam direct writing is disadvantageous in requiring long time for the formation of patterns.

Thus, a directed self-assembly technique (DSA: Directed Self-Assembly) has been studied as a technique for accomplishing the finer patterns at low costs and for a relatively short time period (for example, Patent Documents 1 and 2). The directed self-assembly technique utilizes the property of a specific block copolymer that is self-assembled to have a spherical shape, a plate-like shape, a laminar shape or the like.

PRIOR ART DOCUMENTS

Patent Documents

Patent Document 1: Japanese Patent Application Laid-Open No. 2014-22570
Patent Document 2: Japanese Unexamined Patent Application Publication (Translation of PCT Application) No. 2016-518701

SUMMARY

Problem to be Solved by the Invention

Unfortunately, the directed self-assembly technique has a problem that a large number of defects are prone to occur in the formed patterns. In particular, defects peculiar to the directed self-assembly technique and known as dislocations that refer to the positional displacement of patterns have occurred.

In view of the foregoing, it is therefore an object of the present invention to provide a substrate processing method capable of forming patterns with a small number of defects by means of a directed self-assembly technique.

Means to Solve the Problem

To solve the aforementioned problem, a first aspect of the present invention is intended for a substrate processing method for forming a pattern on a substrate. The method comprises: a depositing step for forming a processing film made of a directed self-assembly material on the substrate; and a flash irradiation step for irradiating the processing film with a flash of light from a flash lamp.

A second aspect of the present invention is intended for the substrate processing method of the first aspect. The method further comprises a preheating step for preheating the processing film at a predetermined treatment temperature before the flash irradiation step.

A third aspect of the present invention is intended for the substrate processing method of the second aspect, wherein the treatment temperature is a temperature at which the directed self-assembly material is phase-separated.

A fourth aspect of the present invention is intended for the substrate processing method of the first aspect, wherein the processing film is irradiated with a flash of light in an atmosphere containing at least one solvent selected from the group consisting of toluene, heptane, acetone, propylene glycol monomethyl ether acetate, propylene glycol monomethyl ether, cyclohexanone, carbon disulfide, and tetrahydrofuran in the flash irradiation step.

A fifth aspect of the present invention is intended for the substrate processing method of the first aspect, wherein the line width of the pattern is controlled by a time period for flash irradiation in the flash irradiation step.

A sixth aspect of the present invention is intended for the substrate processing method of the first aspect, wherein the flash irradiation step is repeated a plurality of times.

Effects of the Invention in the substrate processing method according to the first to sixth aspects, the processing film made of the directed self-assembly material is irradiated with a flash of light from the flash lamp. This increases the fluidity of polymers constituting the processing film to suppress the occurrence of defects, thereby achieving the formation of a pattern with a small number of defects by means of a directed self-assembly technique.

In particular, in the substrate processing method according to the fourth aspect, the processing film is irradiated with a flash of light in an atmosphere containing at least one solvent selected from the group consisting of toluene, heptane, acetone, propylene glycol monomethyl ether acetate, propylene glycol monomethyl ether, cyclohexanone, carbon disulfide, and tetrahydrofuran in the flash irradiation step.

Thus, the processing film is swelled by the solvent. This achieves the formation of the pattern with a smaller number of defects.

DESCRIPTION OF EMBODIMENT(S)

An embodiment according to the present invention will now be described in detail with reference to the drawings.

Figure 1:
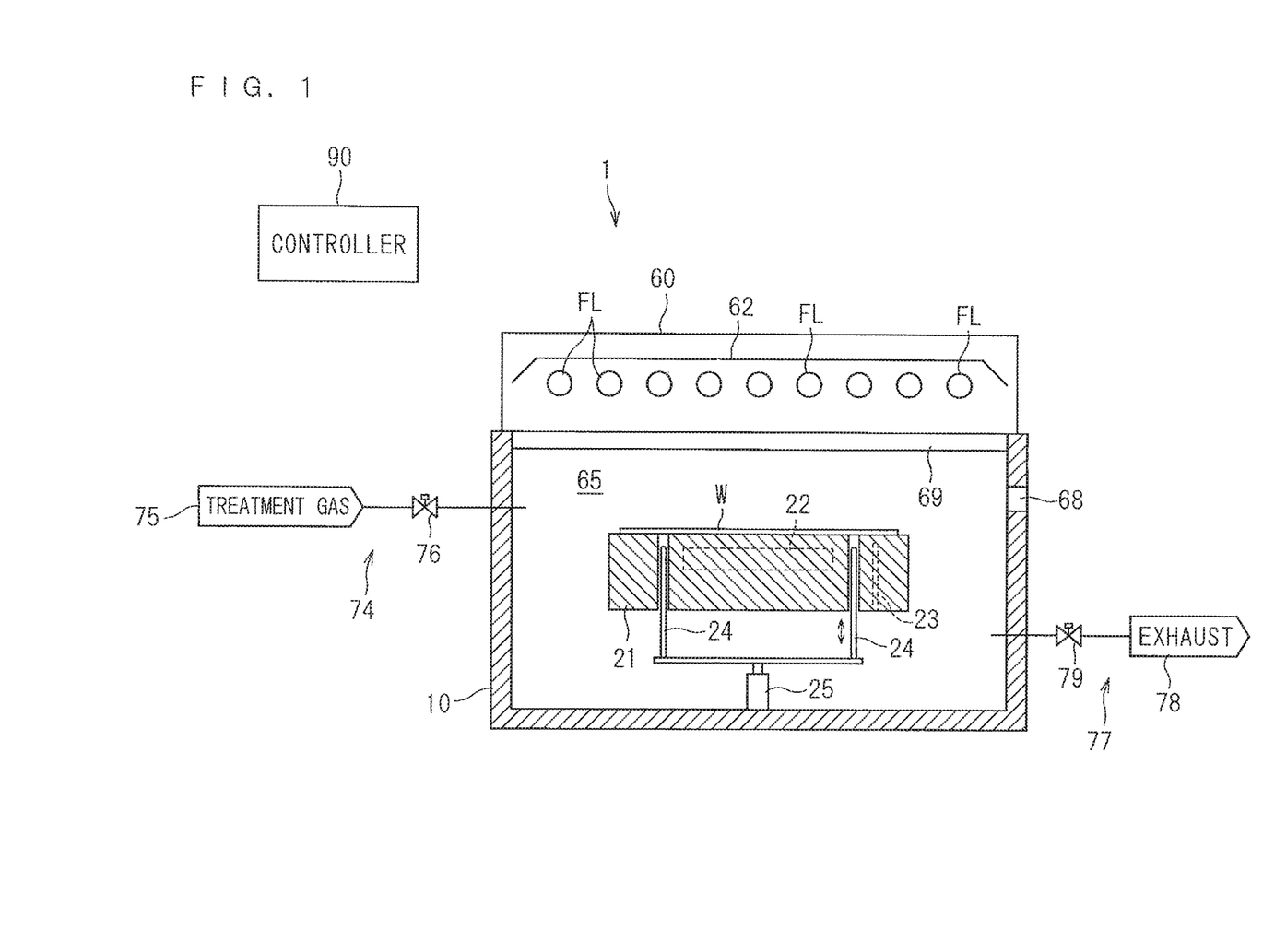
FIG. 1 is a view showing a configuration of principal parts of a heat treatment apparatus for use in a substrate processing method according to the present invention.

First, a substrate processing apparatus for use in a substrate processing method according to the present invention will be described. FIG. 1 is a view showing a configuration of principal parts of a heat treatment apparatus 1 for use in the substrate processing method according to the present invention. The heat treatment apparatus 1 is a flash lamp annealing (FLA) apparatus for irradiating a substrate W with flashes of light. It should be noted that the dimensions of components and the number of components are shown in exaggeration or in simplified form, as appropriate, in FIG. 1 and the subsequent figures for the sake of easier understanding.

The heat treatment apparatus 1 includes: a chamber 10 for receiving a substrate W therein; a holding plate 21 for placing the substrate W thereon within the chamber 10 to hold the substrate W; an exhaust part 77 for exhausting a gas from the chamber 10; a gas supply part 74 for supplying a treatment gas into the chamber 10; and a flash irradiation part 60 for irradiating the substrate W with flashes of light. The heat treatment apparatus 1 further includes a controller 90 for controlling these parts to cause these parts to perform flash irradiation.

The chamber 10 is an enclosure provided under the flash irradiation part 60 and capable of receiving a substrate W therein. A chamber window 69 is mounted in a top opening of the chamber 10 to close the top opening. A space surrounded by side and bottom walls of the chamber 10 and the chamber window 69 is defined as a heat treatment space 65. The chamber window 69 which constitutes a ceiling portion of the chamber 10 is a plate-like member made of quartz, and serves as a quartz window that transmits flashes of light emitted from the flash irradiation part 60 therethrough into the heat treatment space 65.

The side wall of the chamber 10 is provided with a transport opening 68 for the transport of a substrate W therethrough into and out of the chamber 10. The transport opening 68 is openable and closable by a shutter not shown. When the transport opening 68 is open, a transport robot not shown is allowed to transport a substrate W into and out of the chamber 10. When the transport opening 68 is closed, the heat treatment space 65 is an enclosed space so that the ventilation between the heat treatment space 65 and the outside is interrupted.

The holding plate 21 is a generally disk-shaped member made of metal (e.g., aluminum) and incorporating a preheating mechanism 22. The holding plate 21 places a substrate W thereon within the chamber 10 to hold the substrate W in a horizontal attitude (in such an attitude that the normal to a main surface of the substrate W extends in a vertical direction). For example, a resistance heating element such as a nichrome wire may be used as the preheating mechanism 22. The preheating mechanism is disposed at a uniform density at least in a region of the holding plate 21 opposed to a substrate W placed thereon. This enables the preheating mechanism 22 to heat the region uniformly. The provision of the preheating mechanism 22 in the holding plate 21 causes the holding plate 21 to function as a hot plate.

A temperature sensor 23 constructed using a thermocouple is provided inside the holding plate 21. The temperature sensor 23 measures the temperature of part of the holding plate 21 close to the upper surface thereof. The result of measurement with the temperature sensor 23 is transmitted to the controller 90. The controller 90 controls the preheating mechanism 22 so that the temperature of the holding plate 21 measured with the temperature sensor 23 reaches a previously set preheating temperature. In other words, the controller 90 effects feedback control of the temperature of the holding plate 21, based on the result of measurement with the temperature sensor 23. It should be noted that a plurality of temperature sensors 23 may be provided in the region of the holding plate 21 opposed to a substrate W placed thereon.

Multiple (at least three) proximity balls not shown are disposed on the upper surface of the holding plate 21. The proximity balls are made of a material such as alumina ($Al_2O_3$), for example, and are provided in such a manner that the upper ends thereof protrude slightly from the upper surface of the holding plate 21. Thus, a slight space known as what is called a proximity gap is created between the back surface of the substrate W and the upper surface of the holding plate 21 when the substrate W is supported by the multiple proximity balls. Alternatively, a susceptor made of quartz may be provided on the upper surface of the holding plate 21 so that the substrate W is supported through the susceptor.

The holding plate 21 is provided with a plurality of (in this embodiment, three) lift pins 24 extendable out of and retractable into the upper surface thereof. The vertical positions of the upper ends of the three lift pins 24 are included in the same horizontal plane. The three lift pins 24 are moved up and down in a vertical direction together by an air cylinder 25. Each of the lift pins 24 is moved up and down along the interior of a through hole extending vertically through the holding plate 21. As the air cylinder 25 moves the three lift pins 24 upwardly, the tips of the respective lift pins 24 protrude from the upper surface of the holding plate 21. On the other hand, as the air cylinder 25 moves the three lift pins 24 downwardly, the tips of the respective lift pins 24 are retracted into the respective through holes of the holding plate 21.

The gas supply part 74 supplies the treatment gas into the chamber 10. The gas supply part 74 includes a treatment gas supply source 75 and a valve 76. By opening the valve 76, the gas supply part 74 supplies the treatment gas into the heat treatment space 65 of the chamber 10. In the present embodiment, nitrogen ($N_2$) is used as the treatment gas. Alternatively, after the atmosphere in the chamber 10 is temporarily replaced with a nitrogen ($N_2$) atmosphere to form a low oxygen atmosphere, the vapor of a solvent selected from the group consisting of toluene, heptane, ac propylene glycol monomethyl ether acetate (PGMEA), propylene glycol mono y ether (PGME), cyclohexanone, carbon disulfide, and tetrahydrofuran may be supplied as the treatment gas. The treatment gas supply source 75 may be comprised of a tank and a feeding pump which are provided in the heat treatment apparatus 1 or may employ a utility system in a factory in which the heat treatment apparatus 1 is installed.

The exhaust part 77 includes an exhauster 78 and a valve 79. By opening the valve 79, the atmosphere in the chamber 10 is exhausted. A vacuum pump or a utility exhaust system in a factory in which the heat treatment apparatus 1 is installed may be used as the exhauster 78. When the vacuum pump is used as the exhauster 78 to exhaust the atmosphere in the heat treatment space 65 that is an enclosed space without any gas supply from the gas supply part 74, the atmosphere in the chamber 10 is reduced in pressure to a vacuum atmosphere. When the vacuum pump is not used as the exhauster 78, the pressure of the atmosphere in the chamber 10 is reduced to a pressure lower than atmospheric pressure by exhausting the atmosphere in the heat treatment space 65 without any gas supply from the gas supply part 74.

The flash irradiation part 60 is provided over the chamber 10. The flash irradiation part 60 includes a light source comprised of a plurality of flash lamps FL, and a reflector 62 provided so as to cover the light source from above. The flash irradiation part 60 directs flashes of light from the flash lamps FL through the chamber window 69 made of quartz onto the substrate W held by the holding plate 21 within the chamber 10.

The flash lamps FL, each of which is a rod-shaped lamp having an elongated cylindrical shape, are arranged in a plane so that the longitudinal directions of the respective flash lamps FL are in parallel with each other along a main surface of the substrate W held by the holding plate 21 (that is, in a horizontal direction). Thus, a plane defined by the arrangement of the flash lamps FL is also a horizontal plane.

Figure 2:
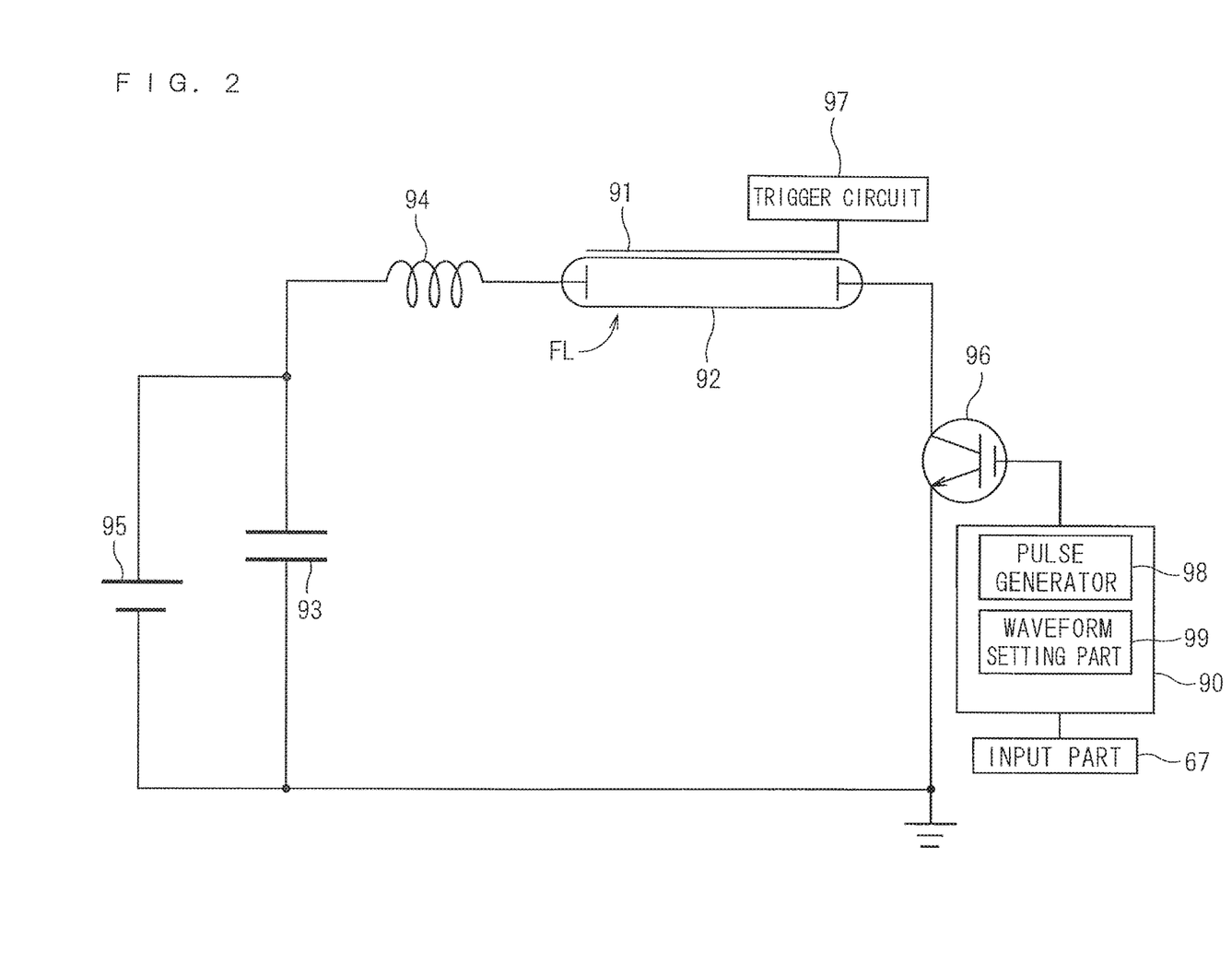
FIG. 2 is a diagram showing a driving circuit for a flash lamp.

FIG. 2 is a diagram showing a driving circuit for each flash lamp FL. As illustrated in FIG. 2, a capacitor 93, a coil 94, a flash lamp FL, and an IGBT (insulated-gate bipolar transistor) 96 are connected in series. Also, as shown in FIG. 2, the controller 90 includes a pulse generator 98 and a waveform setting part 99, and is connected to an input part 67, Examples of the input part 67 used herein include various known input devices such as a keyboard, a mouse, and a touch panel. The waveform setting part 99 sets the waveform of a pulse signal, based on an input from the input part 67, and the pulse generator 98 generates the pulse signal in accordance with that waveform.

The flash lamp FL includes a rod-shaped glass tube (discharge tube) 92 containing xenon gas sealed therein and having positive and negative electrodes provided on opposite ends thereof, and a trigger electrode 91 attached to the outer peripheral surface of the glass tube 92. A power supply unit 95 applies a predetermined voltage to the capacitor 93, and the capacitor 93 is charged in accordance with the applied voltage (charging voltage). A trigger circuit 97 is capable of applying a high voltage to the trigger electrode 91. The timing of the voltage application from the trigger circuit 97 to the trigger electrode 91 is under the control of the controller 90.

The IGBT 96 is a bipolar transistor which includes a MOSFET (Metal Oxide Semiconductor Field effect transistor) incorporated in the gate portion thereof, and is also a switching element suitable for handling a large amount of power. The pulse generator 98 in the controller 90 applies the pulse signal to the gate of the IGBT 96. When a voltage ("High" voltage) not less than a predetermined level is applied to the gate of the IGBT 96, the IGBT 96 turns on. When a voltage ("Low" voltage) less than the predetermined level is applied to the gate of the IGBT 96, the IGBT 96 turns off. In this manner, the driving circuit including the flash lamp FL is turned on and off by the IGBT 96. By turning the IGBT 96 on and off, a connection between the flash lamp FL and the capacitor 93 corresponding thereto is made and broken, so that the current flowing through the flash lamp FL is on-off controlled.

Even if, with the capacitor 93 in the charged state, the IGBT 96 turns on to apply a high voltage across the electrodes of the glass tube 92, no electricity will flow through the glass tube 92 in a normal state because the xenon gas is electrically insulative. However, when the trigger circuit 97 applies a high voltage to the trigger electrode 91 to produce an electrical breakdown, an electrical discharge between the electrodes causes a current to flow momentarily in the glass tube 92, so that xenon atoms or molecules are excited at this time to cause light emission.

Referring again to FIG. 1, the reflector 62 is provided over the plurality of flash lamps FL so as to cover all of the flash lamps FL. A fundamental function of the reflector 62 is to reflect flashes of light emitted from the plurality of flash lamps FL toward the heat treatment space 65. The reflector 62 is a plate made of an aluminum alloy. A surface of the reflector 62 (a surface which faces the flash lamps FL) is roughened by abrasive blasting.

The controller 90 controls the aforementioned various operating mechanisms provided in the heat treatment apparatus 1. The controller 90 is similar in hardware configuration to a typical computer. Specifically, the controller 90 includes a CPU that is a circuit for performing various computation processes, a ROM or read-only memory for storing a basic program therein, a RAM or readable/writable memory for storing various pieces of information therein, and a magnetic disk for storing control applications, data and the like thereon. The CPU in the controller 90 executes a predetermined processing program, whereby the processes in the heat treatment apparatus 1 proceed.

Figure 3:
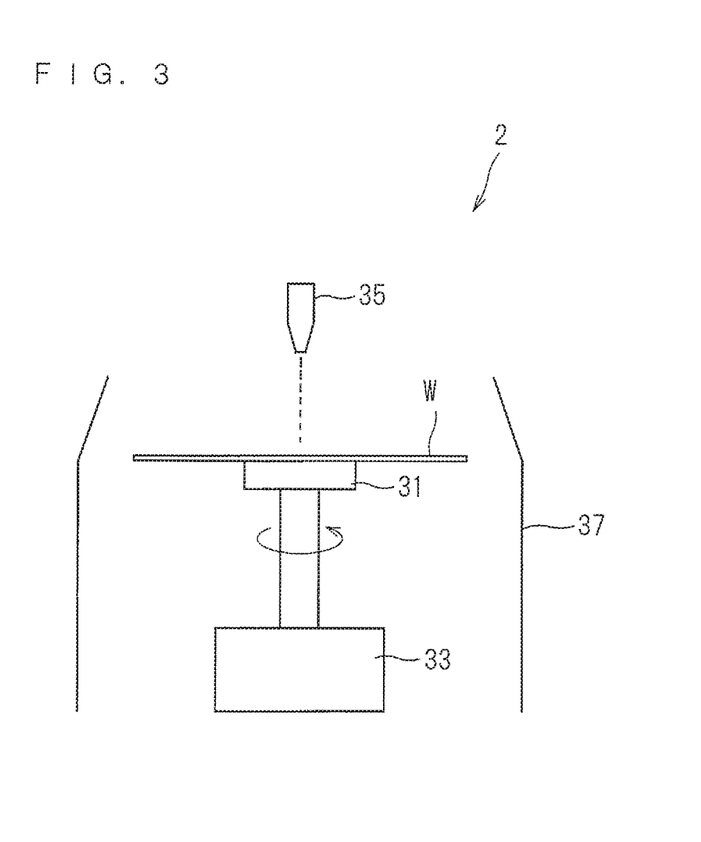
FIG. 3 is a view showing a configuration of principal parts of a coating processing apparatus for use in the substrate processing method according to the present invention.

Next, FIG. 3 is a view showing a configuration of principal parts of a coating processing apparatus 2 for use in the substrate processing method according to the present invention. The coating processing apparatus 2 applies a processing liquid made of a directed self-assembly material to a substrate W to form a processing film of the material.

The coating processing apparatus 2 includes a spin chuck 31 for holding a substrate W, a cup 37 provided so as to surround the spin chuck 31, and a coating nozzle 35 for ejecting the processing liquid. The spin chuck 31 holds the substrate W in a horizontal attitude by vacuum-suctioning a central portion of a lower surface of the substrate W. The spin chuck 31 is driven to rotate in a horizontal plane by a drive motor 33. The cup 37 receives and collects excess part of the processing liquid splashed or flown from the rotating substrate W.

The coating nozzle 35 ejects the processing liquid toward a central portion of an upper surface of the substrate W rotating while being held by the spin chuck 31. The coating nozzle 35 ejects the processing liquid made of the directed self assembly material for use in the directed self-assembly technique onto the substrate W. When ejected onto the central portion of the upper surface of the rotating substrate W, the processing liquid made of the directed self-assembly material spreads over the upper surface of the substrate W by centrifugal force, so that the upper surface of the substrate W is coated with the processing liquid. Thus, the processing film made of the directed self-assembly material is formed on the substrate W, The directed self-assembly material includes a block copolymer comprised of two or more types of polymers. Preferably, the two or more types of polymers constituting the block copolymer are immiscible with each other.

In the present embodiment, the processing liquid made of the directed self-assembly material including the block copolymer comprised of two types of polymers is ejected from the coating nozzle 35. Examples of the combination of the two types of polymers includes: polystyrene-polymethyl methacrylate (PS-PMMA); polystyrene-polydimethylsiloxane (PS-PDMS); polyethylene-polyferrocenyl dimethylsilane (PS-PFS); polystyrene-polyethylene oxide (PS-PEO); polystyrene-polyvinylpyridine (PS-PVP); polyethylene-polyhydroxystyrene (PS-PHOST); and polymethyl methacrylate-polymethacrylate polyhedral oligomeric silsesquioxane (PMMA-PMAPOSS).

Figure 4:
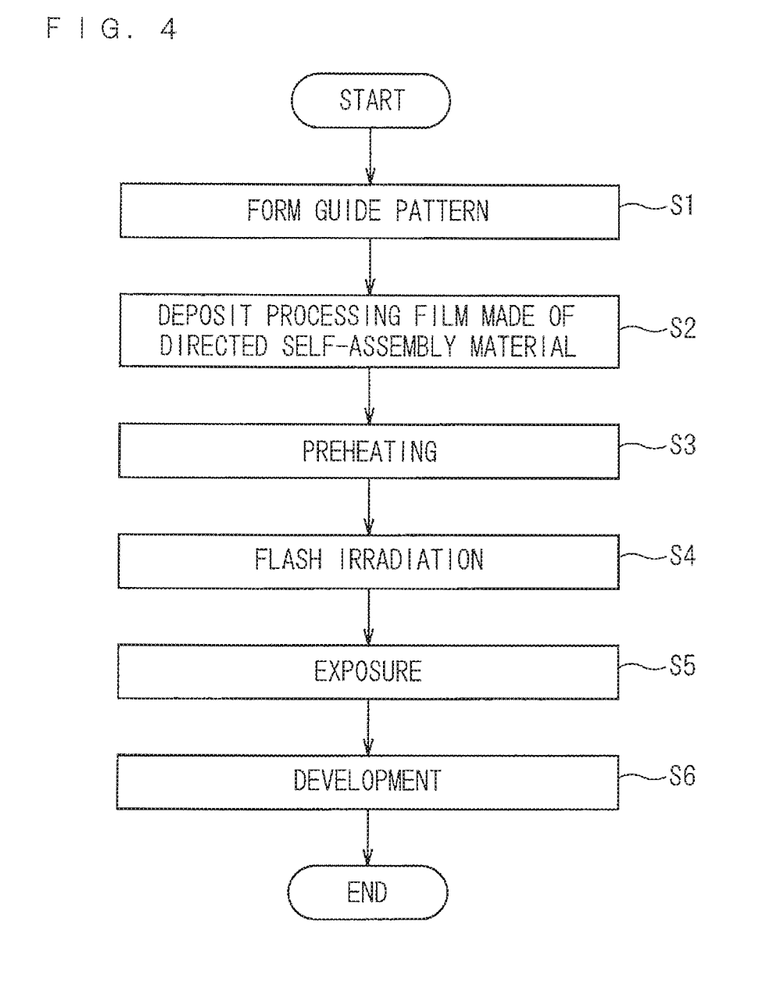
FIG. 4 is a flow diagram showing a procedure for the process of forming a pattern on a substrate.
Figure 5:
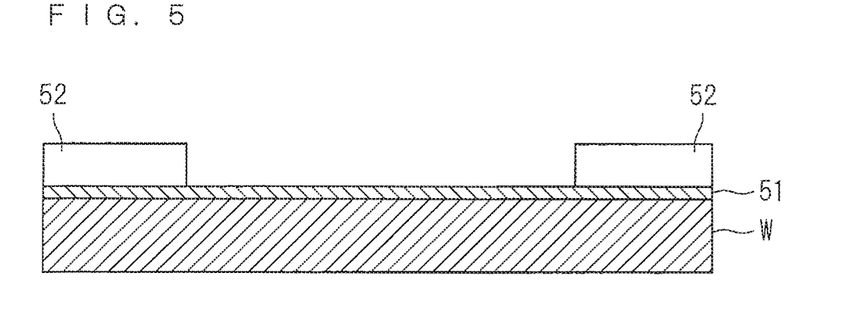
FIG. 5 is a sectional view schematically showing a substrate with a guide pattern formed thereon.

Next, a procedure for the process of forming a pattern on a substrate W will be described. FIG. 4 is a flow diagram showing the procedure for the process of forming a pattern on the substrate W, Prior to the substrate processing method according to the present invention, a foundation layer and a guide pattern are initially formed on the substrate W to be processed (Step S1). FIG. 5 is a sectional view schematically showing the substrate W with the guide pattern formed thereon.

A foundation layer 51 is formed on the upper surface of the substrate W. A guide pattern 52 is formed on the foundation layer 51. The guide pattern 52 is formed by a known photolithography technique. Specifically, a resist is applied onto the foundation layer 51, and an exposure process is performed on the resist with the use of a mask where the shape of the guide pattern 52 is drawn. Thereafter, a development process is performed to remove excess resist, thereby forming the guide pattern 52.

Figure 6:
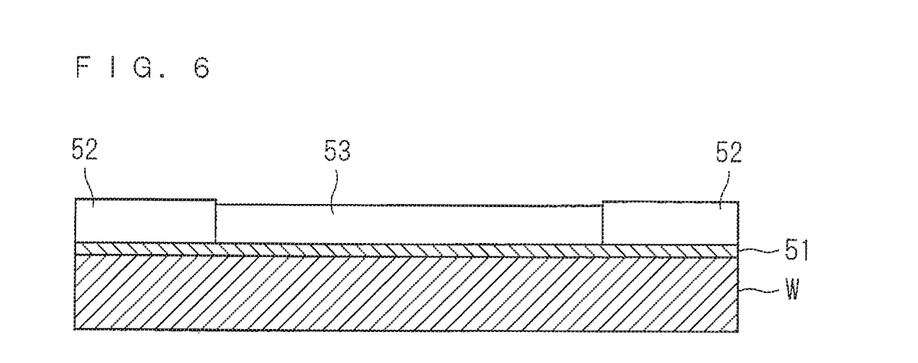
FIG. 6 is a sectional view schematically showing a substrate with a processing film of a directed self-assembly material formed thereon.

The substrate W with the guide pattern 52 formed thereon as shown in FIG. 5 is transported into the coating processing apparatus 2, and the processing film made of the directed self-assembly material is deposited on the substrate W (Step S2). FIG. 6 is a sectional view schematically showing the substrate W with the processing film of the directed self-assembly material formed thereon. In the coating processing apparatus 2, the substrate W as shown in FIG. 5 is rotated in a horizontal plane while being held by the spin chuck 31. The processing liquid made of the directed self-assembly material comprised of two types of polymers is ejected from the coating nozzle 35 onto the central portion of the upper surface of the rotating substrate W. Thus, a processing film 53 made of the directed self-assembly material is formed on a region of the foundation layer 51 where the guide pattern 52 is not formed, as shown in FIG. 6.

Next, the substrate W with the processing film 53 formed thereon is transported into the heat treatment apparatus 1. The substrate W transported into the chamber 10 of the heat treatment apparatus 1 is transferred to the three lift pins 24 protruding upwardly from the upper surface of the holding plate 21. After receiving the substrate W, the lift pins 24 are moved downwardly, so that the tips of the respective lift pins 24 are retracted into the respective through holes of the holding plate 21. Thus, the substrate W is placed on the holding plate 21.

After the substrate W is transported into the chamber 10 and the heat treatment space 65 is caused to become the enclosed space, the gas supply part 74 supplies nitrogen gas into the chamber 10, and the exhaust part 77 exhausts the atmosphere from the chamber 10, so that the atmosphere in the chamber 10 is replaced with a nitrogen atmosphere. This provides a low oxygen atmosphere (an oxygen concentration of not more than 10 ppm) in the heat treatment space 65 of the chamber 10.

The holding plate 21 is already heated to the previously set preheating temperature by the preheating mechanism 22 incorporated therein. The substrate W is placed on the holding plate 21, whereby the entire substrate W including the processing film 53 made of the directed self-assembly material is preheated (Step S3). The preheating temperature of the processing film 53 by means of the holding plate 21 is a temperature at which the directed self-assembly material comprised of the two types of polymers is phase-separated, and specifically ranges from room temperature to 350° C. (in the present embodiment, 250° C.). Depending on the combination of the two types of polymers, the directed self-assembly material is phase-separated at room temperature in some cases. In the case where the processing film 53 is made of the directed self-assembly material comprised of such polymers, the preheating mechanism 22 does not heat the holding plate 21, so that the processing film 53 is not preheated. Alternatively, the preheating mechanism 22 may precisely control the temperature of the holding plate 21 to a predetermined room temperature.

Figure 7:
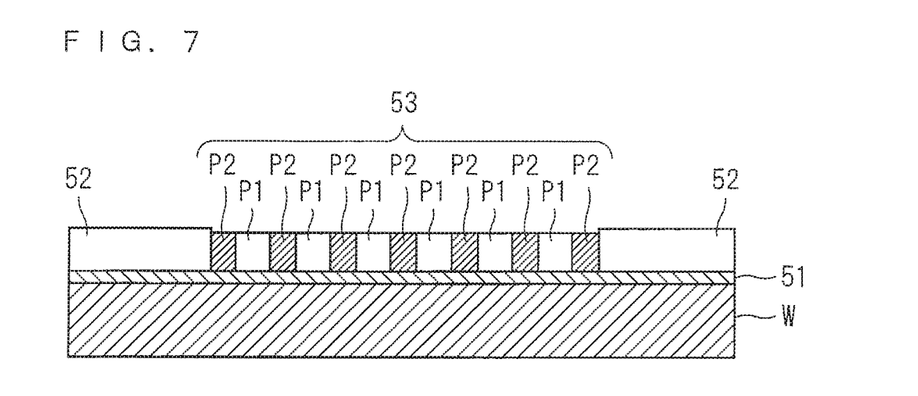
FIG. 7 is a sectional view schematically showing a substrate with phase separation caused in the processing film.

The preheating of the substrate W with the processing film 53 formed thereon by means of the holding plate 21 causes microphase separation of the processing film 53 made of the directed self-assembly material. FIG. 7 is a sectional view schematically showing the substrate W with the phase separation caused in the processing film 53, The processing film 53 is made of the directed self-assembly material including the block copolymer comprised of two types of polymers. The preheating of the processing film 53 containing the two types of polymers at the predetermined preheating temperature causes the two types of polymers to be phase-separated, thereby forming a pattern P1 made of one of the polymers and a pattern P2 made of the other polymer. In the example of FIG. 7, the linear pattern P1 and the linear pattern P2 are formed so as to be disposed alternately along the guide pattern 52.

This provides the finer linear patterns P1 and P2 formed in lines of the guide pattern 52 formed by the conventional photolithography technique. Thus, the use of the phase separation of the processing film 53 made of the directed self-assembly material achieves the formation of patterns finer than 45 nm that has been the limit of the conventionally photolithographically formed fine patterns.

In the directed self-assembly technique, defects are unfortunately prone to occur in patterns when the two types of polymers are heated and phase-separated. For example, there are cases in which adjacent lines of the pattern P1 join into one line. Even when heating is performed only by the holding plate 21, such defects are reduced by heating the processing film 53 at higher temperatures or by performing the heating treatment for a longer time period. However, heating the processing film 53 at a temperature higher than 350° C. gives rise to a problem that the polymers constituting the processing film 53 are decomposed. Also, the reduction in defects at a heating temperature of 350° C. or below requires the heating treatment time of not less than one hour. As a result, a practical level of throughput is not obtained.

For these reasons, the processing film 53 made of the directed self-assembly material is irradiated with flashes of light from the flash lamps FL in the present embodiment while being preheated (Step S4). For the flash irradiation from each of the flash lamps FL the capacitor 93 is charged in advance by the power supply unit 95. Then, with the capacitor 93 in the charged state, the pulse generator 98 in the controller 90 outputs a pulse signal to the IGBT 96 to drive the IGBT 96 on and off.

The waveform of the pulse signal is specified by inputting from the input part 67 a recipe that is a sequence of defined parameters including a time interval (ON time) equivalent to the pulse width and a time interval (OFF time) between pulses. After an operator inputs such a recipe from the input part 67 to the controller 90, the waveform setting part 99 in the controller 90 sets a pulse waveform having repeated ON and OFF time intervals in accordance with the recipe. Then, the pulse generator 98 outputs the pulse signal in accordance with the pulse waveform set by the waveform setting part 99. As a result, the pulse signal having the repeated ON and OFF time intervals is applied to the gate of the IGBT 96 to control the driving on and off of the IGBT 96. Specifically, the IGBT 96 is on when the pulse signal inputted to the gate of the IGBT 96 is on, and the IGBT 96 is off when the pulse signal is off.

In synchronism with the turning on of the pulse signal outputted from the pulse generator 98, the controller 90 controls the trigger circuit 97 to apply a high voltage (trigger voltage) to the trigger electrode 91. The pulse signal is inputted to the gate of the IGBT 96, with the electrical charges stored in the capacitor 93, and the high voltage is applied to the trigger electrode 91 in synchronism with the turning on of the pulse signal, whereby a current flows across the electrodes of the glass tube 92 whenever the pulse signal is on. The resultant excitation of xenon atoms or molecules induces light emission.

In this manner, the IGBT 96 serving as a switching element is connected in the circuit and the pulse signal having the repeated ON and OFF time intervals is outputted to the gate of the IGBT 96. Thus, the IGBT 96 intermittently supplies the electrical charges from the capacitor 93 to a corresponding flash lamp FL to control the current flowing through the flash lamp FL. As a result, the light emission from the flash lamp FL is accordingly chopper-controlled, which allows the electrical charges stored in the capacitor 93 to be consumed in a divided manner. This enables the flash lamp FL to repeatedly flash on and off in an extremely short time. It should be noted that, before the value of the current flowing through the flash lamp FL reaches exactly zero, the next pulse is applied to the gate of the IGBT 96 to increase the current value again. For this reason, the emission output never reaches exactly zero even while the flash lamp FL repeatedly flashes on and off Thus, while such pulse signals having a relatively short time intervals are outputted to the IGBT 96, the flash lamp FL emits light continuously.

The IGBT 96 effects on-off control of the current flowing through the flash lamp FL to freely define the light emission pattern (time waveform of light emission outputs) of the flash lamp FL, thereby freely adjusting the light emission time and the light emission intensity. The on-off driving pattern of the IGBT 96 is defined by the time interval equivalent to the pulse width inputted from the input part 67 and the time interval between the pulses. That is, the incorporation of the IGBT 96 into the driving circuit for the flash lamp FL allows the light emission pattern of the flash lamp FL to be freely defined only by suitably setting the time interval equivalent to the pulse width and the time interval between the pulses inputted from the input part 67.

Specifically, for example, increasing the ratio of the time interval equivalent to the pulse width inputted from the input part 67 to the time interval between the pulses increases the current flowing through the flash lamp FL to increase the light intensity. On the other hand, decreasing the ratio of the time interval equivalent to the pulse width inputted from the input part 67 to the time interval between the pulses decreases the current flowing through the flash lamp FL to decrease the light emission intensity. When the ratio of the time interval equivalent to the pulse width inputted from the input part 67 to the time interval between the pulses is appropriately controlled, the light emission intensity of the flash lamp FL is maintained constant. Further, increasing the total time of a combination of the time interval equivalent to the pulse width inputted from the input part 67 and the time interval between the pulses causes the current to continue flowing through the flash lamp FL for a relatively long time, thereby increasing the light emission time of the flash lamp FL. In the present embodiment, the light emission time of the flash lamp FL is in the range of 0.1 to 100 milliseconds.

In this manner, the front surface of the substrate W including the processing film 53 is irradiated with flashes of light from the flash lamps FL for a time period in the range of 0.1 to 100 milliseconds. Part of the flashes of light emitted from the flash lamps FL travel directly toward the chamber 10. The remainder of the flashes of light are reflected once from the reflector 62, and then travel toward the chamber 10.

The temperature of the front surface of the substrate W including the processing film 53 irradiated with flashes of light increases from the preheating temperature in an extremely short time to momentarily reach a temperature ranging from 200° to 500° C. The processing film 53 is thus momentarily heated to a temperature ranging from 200' to 500° C. to receive energy. This increases the fluidity of the polymers in the processing film 53 to reduce defects. If the processing film 53 is heated to a temperature higher than 350° C., there is a danger that the polymers are decomposed. However, the time period for the flash irradiation is an extremely short time period in the range of 0.1 to 100 milliseconds. The decomposition of the polymers does not occur even if the processing film 53 is heated to a temperature higher than 350° C. for such an extremely short time period. Also, the decrease in throughput does not occur because the time period for the flash irradiation is an extremely short time period in the range of 0.1 to 100 milliseconds.

As described above, the processing film 53 made of the directed self-assembly material is irradiated with flashes of light from the flash lamps FL while being preheated by the holding plate 21. This causes the two types of polymers constituting the processing film 53 to be properly phase-separated, thereby achieving the formation of fine patterns while suppressing the production of defects.

After the flash irradiation is completed, the front surface temperature of the substrate W decreases rapidly. Then, the three lift pins 24 move upwardly to push the substrate W placed on the holding plate 21 upwardly, so that the substrate W is spaced apart from the holding plate 21. The temperature of the substrate W decreases further from the preheating temperature because the substrate W is spaced apart from the holding plate 21. Thereafter, the transport opening 68 is opened, and the substrate W is transported out of the chamber 10. This completes the substrate processing in the heat treatment apparatus 1.

Next, the exposure process is performed on the substrate W subjected to the treatment by the flash irradiation (Step S5). The exposure process is performed by a separate exposure processing apparatus different from the heat treatment apparatus 1 and the coating processing apparatus 2. The exposure process in Step S5 is not pattern exposure using a mask but is the process of uniformly exposing the entire front surface of the substrate W including the processing film 53 to light at a time. The exposure process severs the two types of polymers constituting the processing film 53 from each other to achieve separation between the pattern P1 and the pattern P2.

Thereafter, the development process is performed on the substrate W subjected to the exposure process (Step S6). The development process is performed by a separate development processing apparatus different from the heat treatment apparatus 1 and the coating processing apparatus 2. The development processing apparatus has a configuration similar to that of the coating processing apparatus 2 (FIG. 3). In the development process, a developer is supplied to the front surface of the substrate W including the processing film 53 to remove the one pattern P1 by dissolution.

Figure 8:
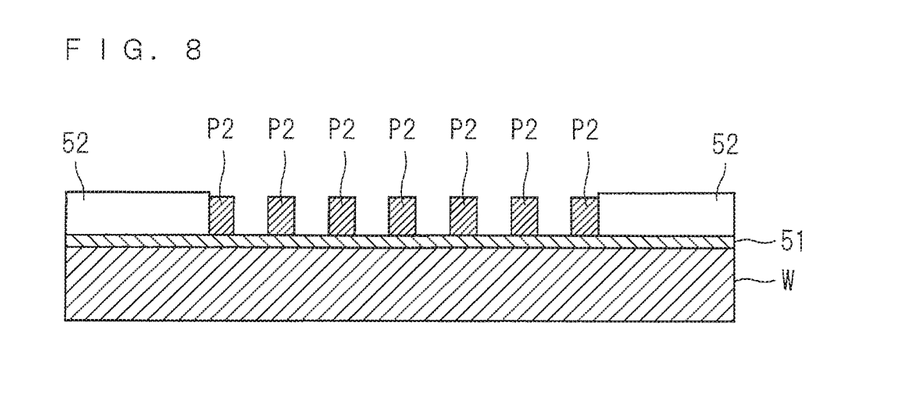
FIG. 8 is a sectional view schematically showing a substrate with one pattern removed.

FIG. 8 is a sectional view schematically showing the substrate W with the one pattern P1 removed. By removing the one pattern P1 in the development process, the other pattern P2 remains unremoved in a region where the guide pattern 52 is not formed on the substrate W. In this manner, a fine pattern is finally formed on the substrate W.

In the present embodiment, the processing film 53 made of the directed self-assembly material is not only merely heated at the phase separation temperature but also irradiated with flashes of light from the flash lamps FL while being preheated at the phase separation temperature by the holding plate 21. The flash irradiation of the processing film 53 in which the phase separation proceeds increases the fluidity of the polymers to reduce defects, That is, the pattern with a small number of defects is formed by applying the flash irradiation to the directed self-assembly technique. Also, the directed self-assembly technique achieves the formation of the pattern finer than 45 nm.

The processing film 53 is momentarily heated to a temperature at which the polymers are decomposed or above by the flash irradiation. However, the decomposition of the polymers is prevented because the processing film 53 is heated at such a temperature for an extremely short time period less than one second. Also, the decrease in throughput does not occur because the time period for the flash irradiation is an extremely short time period in the range of 0.1 to 100 milliseconds.

In the present embodiment, the processing film 53 is irradiated with flashes of light, with a low oxygen atmosphere with an oxygen concentration of not more than 10 ppm maintained in the chamber 10. The heating of the processing film 53 in an atmosphere of air causes degradation due to oxidation of the polymers especially near the film surface of the processing film 53. However, the treatment of the processing film 53 in a low oxygen atmosphere prevents the pattern from degrading resulting from the oxidation of the polymers. As a result, the pattern with a smaller number of defects is formed.

While the embodiment according to the present invention has been described hereinabove, various modifications of the present invention in addition to those described above may be made without departing from the scope and spirit of the invention. For example, the atmosphere in the chamber 10 is the nitrogen atmosphere in the aforementioned embodiment. In place of the nitrogen atmosphere, an atmosphere containing a solvent may be formed in the chamber 10 for the processing of the processing film 53. For the formation of an atmosphere containing a solvent in the chamber 10, the atmosphere in the chamber 10 is temporarily replaced with the nitrogen ($N_2$) atmosphere to form a low oxygen atmosphere, and thereafter the vapor of the solvent is supplied. The atmosphere formed in the chamber 10 is an atmosphere containing at least one solvent selected from the group consisting of toluene, heptane, acetone, propylene glycol monomethyl ether acetate (PGMEA), propylene glycol monomethyl ether (PGME), cyclohexanone, carbon disulfide, and tetrahydrofuran. The flash irradiation is performed on the processing film 53 in the atmosphere containing such a solvent, whereby the processing film 53 made of the directed self-assembly material is swelled by the solvent. This promotes the phase separation to achieve the formation of the pattern with a smaller number of defects.

Also, the line width of the pattern may be controlled by adjusting the time period for the flash irradiation from the flash lamps FL. In the present embodiment, the IGBT 96 is capable of effecting on-off control of the current flowing through each flash lamp FL to thereby freely adjust the light emission time of each flash lamp FL, as mentioned above. Of course, the flash lamps FL cannot emit light for a long time in theory. The time period for the flash irradiation from the flash lamps FL is freely adjustable in the range of 0.1 to 100 milliseconds.

The line width of the pattern is adjustable by a combination of the time period for the flash irradiation from the flash lamps FL and the preheating temperature by means of the holding plate 21. A diligent investigation by the present inventors and the like shows that the line width of the pattern P2 remaining on the substrate W increases as the time period for the flash irradiation increases or as the preheating temperature increases.

In the aforementioned embodiment, the flash irradiation is performed once after the preheating of the substrate W with the processing film 53 formed thereon. However, the flash irradiation from the flash lamps FL may be repeated a plurality of times after the preheating. If there is a danger that strong energy given to the processing film 53 by performing the flash irradiation once causes the decomposition of the polymers, it is desirable to repeat the flash irradiation with relatively weak energy a plurality of times.

Further, a combination of the preheating of the processing film 53 and the flash irradiation thereof may be repeated a plurality of times. Specifically, after the preheating and the flash irradiation are completed once, a procedure including the preheating and the flash irradiation is repeated again. In this case, it is preferable that the substrate W is cooled once to a temperature lower than the preheating temperature after the preheating and the flash irradiation are completed once.

EXPLANATION OF REFERENCE SIGNS

1 Heat treatment apparatus
2 Coating processing apparatus
10 Chamber
21 Holding plate
22 Preheating mechanism
31 Spin chuck
35 Coating nozzle
51 Foundation layer
52 Guide pattern 53 Processing film
60 Flash irradiation part
65 Heat treatment space
69 Chamber window
74 Gas supply part
77 Exhaust part
90 Controller
96 IGBT
FL Flash lamps
P1, P2 Patterns
W Substrate

The invention claimed is:

1. A substrate processing method for forming a pattern on a substrate, said method comprising:
    forming a processing film made of a directed self-assembly material on the substrate; and
    irradiating the an entire surface of the substrate, on which said processing film is formed, with a flash of light from a flash lamp for a time period in a range of 0.1 to 100 milliseconds to increase fluidity of polymers constituting the processing film, wherein
    a line width of a pattern is controlled by a time period for flash irradiation in said irradiating step.

2. The substrate processing method according to claim 1, further comprising preheating said processing film at a predetermined treatment temperature before said irradiating step.

3. The substrate processing method according to claim 2, wherein said treatment temperature is a temperature at which said directed self-assembly material is phase-separated.

4. The substrate processing method according to claim 1, wherein said processing film is irradiated with a flash of light in an atmosphere containing at least one solvent selected from the group consisting of toluene, heptane, acetone, propylene glycol monomethyl ether acetate, propylene glycol monomethyl ether, cyclohexanone, carbon disulfide, and tetrahydrofuran in said irradiating step.

5. The substrate processing method according to claim 1, wherein said irradiating step is repeated a plurality of times.

* * * * *